United States Patent
Suk et al.

(10) Patent No.: US 11,817,501 B2
(45) Date of Patent: Nov. 14, 2023

(54) THREE-DIMENSIONAL, MONOLITHICALLY STACKED FIELD EFFECT TRANSISTORS FORMED ON THE FRONT AND BACKSIDE OF A WAFER

(71) Applicant: International Business Machines Corporation, Armonk, NY (US)

(72) Inventors: Sung Dae Suk, Watervliet, NY (US); Somnath Ghosh, Clifton Park, NY (US); Chen Zhang, Guilderland, NY (US); Junli Wang, Slingerlands, NY (US); Devendra K. Sadana, Pleasantville, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 17/481,647

(22) Filed: Sep. 22, 2021

(65) Prior Publication Data

US 2023/0086967 A1    Mar. 23, 2023

(51) Int. Cl.
  *H01L 29/78* (2006.01)
  *H01L 25/07* (2006.01)
  *H01L 29/08* (2006.01)

(52) U.S. Cl.
  CPC ......... *H01L 29/785* (2013.01); *H01L 25/074* (2013.01); *H01L 29/0847* (2013.01); *H01L 29/7827* (2013.01)

(58) Field of Classification Search
  None
  See application file for complete search history.

(56) References Cited

U.S. PATENT DOCUMENTS

| 7,202,140 | B1 * | 4/2007 | Ang | H01L 21/823807 |
| | | | | 438/455 |
| 8,018,031 | B2 * | 9/2011 | Yanagida | H01L 27/0694 |
| | | | | 257/329 |
| 9,224,811 | B2 | 12/2015 | Cheng et al. | |
| 9,812,575 | B1 | 11/2017 | Reznicek et al. | |
| 9,917,062 | B1 * | 3/2018 | Goktepeli | H01L 21/845 |
| 10,283,411 | B1 | 5/2019 | Hook | |
| 10,446,606 | B2 | 10/2019 | Kumar et al. | |
| 2017/0294340 | A1 | 10/2017 | Hook et al. | |

(Continued)

FOREIGN PATENT DOCUMENTS

| CN | 107706109 A | 2/2018 |
| CN | 109461769 A | 3/2019 |

(Continued)

OTHER PUBLICATIONS

International Search Report; International Application No. PCT CN2022/111724; International Filing Date: Aug. 11, 2022; dated Nov. 11, 2022; 9 pages.

*Primary Examiner* — Cory W Eskridge
(74) *Attorney, Agent, or Firm* — CANTOR COLBURN LLP; Samuel Waldbaum (57) ABSTRACT

A semiconductor device fabrication method is provided. The semiconductor device fabrication method includes frontside semiconductor device processing on a frontside of a wafer, flipping the wafer, backside semiconductor device processing on a backside of the wafer and backside and frontside contact formation processing on the backside and frontside of the wafer, respectively.

12 Claims, 9 Drawing Sheets

Y-view (56) References Cited

U.S. PATENT DOCUMENTS

| | | | |
|---|---|---|---|
| 2018/0175034 A1* | 6/2018 | Goktepeli | ....... H01L 21/823878 |
| 2018/0219090 A1 | 8/2018 | Morrow et al. | |
| 2018/0294284 A1* | 10/2018 | Tarakji | .................... H01L 24/29 |
| 2018/0315838 A1 | 11/2018 | Morrow et al. | |
| 2019/0131394 A1 | 5/2019 | Reznicek et al. | |
| 2019/0131395 A1 | 5/2019 | Lee et al. | |

FOREIGN PATENT DOCUMENTS

| | | | | |
|---|---|---|---|---|
| CN | 110088891 A | | 8/2019 | |
| EP | 2131397 A1 | * | 12/2009 | .............. H01L 27/11 |
| WO | WO-2018052633 A1 | * | 3/2018 | ......... H01L 21/6835 |

* cited by examiner

THREE-DIMENSIONAL, MONOLITHICALLY STACKED FIELD EFFECT TRANSISTORS FORMED ON THE FRONT AND BACKSIDE OF A WAFER

BACKGROUND

The present invention generally relates to semiconductor devices. More specifically, the present invention relates to three-dimensional, monolithically stacked field effect transistors formed on the frontside and backside of a wafer using flip and backside processing.

A fin field-effect transistor (FINFET) is a device based on metal-oxide-semiconductor field-effect transistor (MOSFET) technology. A FINFET can be built on a substrate that can be made of semiconductor material. In a FINFET, a thin silicon "fin" inversion channel is disposed on top of the substrate, allowing the gate to make points of contact at the left and right sides of the fin. The thickness of the fin (measured in the direction from source to drain) determines the effective channel length of the device. A wrap-around gate structure can be provided to offer electrical control over the channel. A nanosheet FET can be used to form a multi-bridge channel FET.

SUMMARY

Embodiments of the present invention are directed to a semiconductor device fabrication method. A non-limiting example of the semiconductor device fabrication method includes frontside semiconductor device processing on a frontside of a wafer, flipping the wafer, backside semiconductor device processing on a backside of the wafer and backside and frontside contact formation processing on the backside and frontside of the wafer, respectively.

Embodiments of the present invention are directed to a semiconductor device fabrication method. A non-limiting example of the semiconductor device fabrication method includes forming an initial structure comprising a first semiconductor element, a second semiconductor element and oxide interposed between the first and second semiconductor elements, forming a first gate around the second semiconductor element and forming source and drain regions at opposite ends of the second semiconductor element, forming an oxide layer to which a handle is attached around the first gate to form a completed initial structure and flipping the completed initial structure. The semiconductor device fabrication method further includes forming a second gate around the first semiconductor element and forming source and drain regions at opposite ends of the first semiconductor element and forming an oxide layer around the second gate.

Embodiments of the invention are directed to a semiconductor device. The semiconductor device includes an internal semiconductor substrate that includes a frontside and a backside opposite the frontside. A frontside semiconductor device is disposed on the frontside of the internal semiconductor substrate. A backside semiconductor device is oriented opposite the frontside semiconductor device and is disposed on the backside of the internal semiconductor substrate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to fabrication processes may or may not be described in detail herein. Moreover, the various tasks and process steps described herein can be incorporated into a more comprehensive procedure or process having additional steps or functionality not described in detail herein. In particular, various steps in the manufacture of semiconductor devices are well known and so, in the interest of brevity, many conventional steps will only be mentioned briefly herein or will be omitted entirely without providing the well-known process details.

Turning now to an overview of technologies that are more specifically relevant to aspects of the invention, vertical stacking of field effect transistors (FETs) refers to complementary-metal-oxide-semiconductor (CMOS) processes or other similar processes whereby two or more FETs are stacked vertically with one on top of the other. Vertical stacking can be used, for example, in the fabrication of FINFETs and nanosheet FETs (NSFETs) where a p-doped component is placed atop an n-doped component or vice versa. Vertical stacking allows for the formation of CMOS or MOSFET devices that are increasingly smaller and smaller over time.

A problem exists, however, in that a vertical stack becomes increasingly difficult to work with and handle as the vertical stack becomes taller. This issue is exacerbated in the case of multi-voltage schemes where fabrication processes lead to vertical stacks with especially tall dimensions.

Turning now to an overview of the aspects of the invention, one or more embodiments of the invention address the above-described shortcomings of the prior art by providing for a three-dimensional (3D) monolithically stacked FIN-FET or NSFET that is formed by a wafer and backside processing method and includes a bottom gate first transistor and a top gate first or gate last transistor or a bottom gate last transistor and a top gate last transistor.

The above-described aspects of the invention address the shortcomings of the prior art by providing for a semiconductor device fabrication process that maintains a vertical stack height within controllable margins by use of a flip and backside process method.

Figure 1:
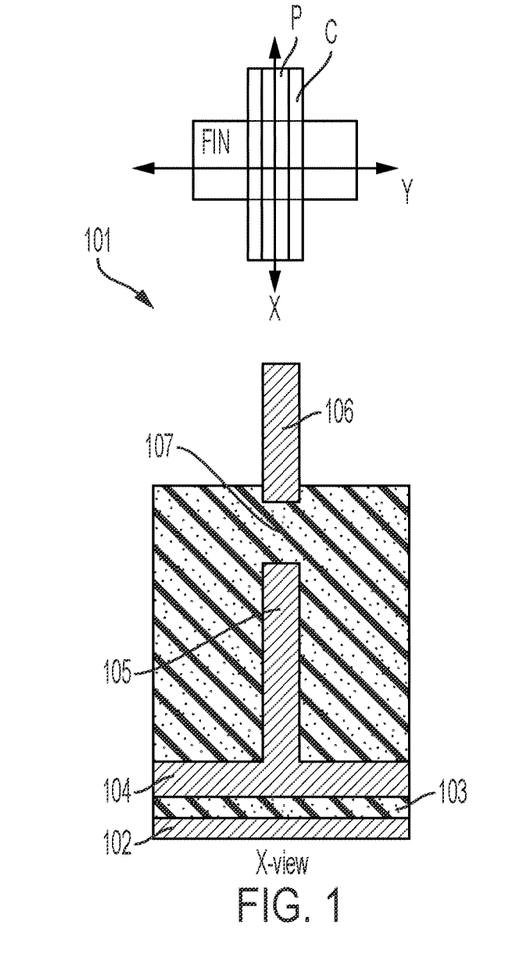
FIG. 1 is a schematic diagram illustrating a cross-sectional view of an initial structure of a semiconductor device in accordance with one or more embodiments of the present invention.

Turning now to a more detailed description of aspects of the present invention, FIGS. 1-10 depict cross-sectional views of a portions of an IC wafer after fabrication operations in accordance with aspects of the invention. Although the cross-sectional diagrams depicted in FIGS. 1-111 are two-dimensional, it is understood that the diagrams depicted in FIGS. 1-11 represent three-dimensional structures. To assist with visualizing the three-dimensional features, a top-down reference diagram is shown in FIG. 1 to provide a reference point for the cross-sectional views (X-view, Y-view) shown in FIGS. 1-10. The X-view is an end view of the gate taken through the length of the fin, and the Y-view is an end view of the fin taken through the length of the gate.

FIG. 1 depicts a cross-sectional X-view of an initial structure 101 of a semiconductor device. The initial structure 101 includes a semiconductor substrate 102, such as a silicon substrate, an oxide layer 103 disposed over the semiconductor substrate 102 and a semiconductor layer 104 disposed over the oxide layer 103. The semiconductor layer 104 can include a first semiconductor or fin element (hereinafter referred to as "a first fin element") 105 extending vertically upwardly from a base layer. The initial structure 101 can further include a second semiconductor or fin element (hereinafter referred to as "a second fin element) 106, which is formed of semiconductor material like the first fin element 105, and additional oxide 107. The second fin element 106 extends upwardly with a lowermost end of the second fin element 106 being separated from an uppermost end of the first fin element 105 by a portion of the additional oxide 107 that is interposed between the uppermost end of the first fin element 105 and a lowermost end of the second fin element 106. The rest of the additional oxide 107 surrounds sides of the first fin element 105 as well as lower sides of the second fin element 106.

While the initial structure 101 includes the first fin element 105 and the second fin element 106, it is to be understood that other embodiments are possible. For example, the first and second fin elements 105 and 106 could be replaced with nanosheets or other similar structures. For purposes of clarity and brevity, however, the following description will relate to the case of the initial structure 101 including the first and second fin elements 105 and 106.

Figure 2:
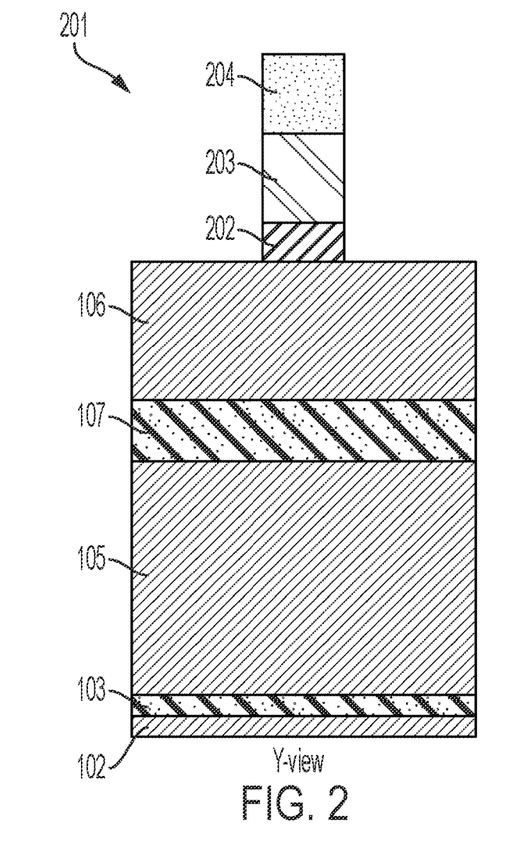
FIG. 2 is a schematic diagram illustrating a cross-sectional view of a secondary initial structure of a semiconductor device taken from a cross-sectional view as compared to FIG. 1 in accordance with one or more embodiments of the present invention.

With reference to FIG. 2, which is a cross-sectional Y-view as compared to the X-view shown in FIG. 1, a secondary initial structure 201 is provided and results from gate formation executed with respect to the initial structure 101 of FIG. 1. As shown in FIG. 2, high-k dielectric 202 is deposited on and around exposed surfaces of the second fin element 106, a gate electrode 203 is formed around the high-k dielectric 202 and spacer material 204 is deposited on the gate electrode 203. The gate electrode 203 can be a conductor including, but not limited to, tungsten and other similar metallic materials and the spacer material 204 can include dielectric material.

Figure 3:
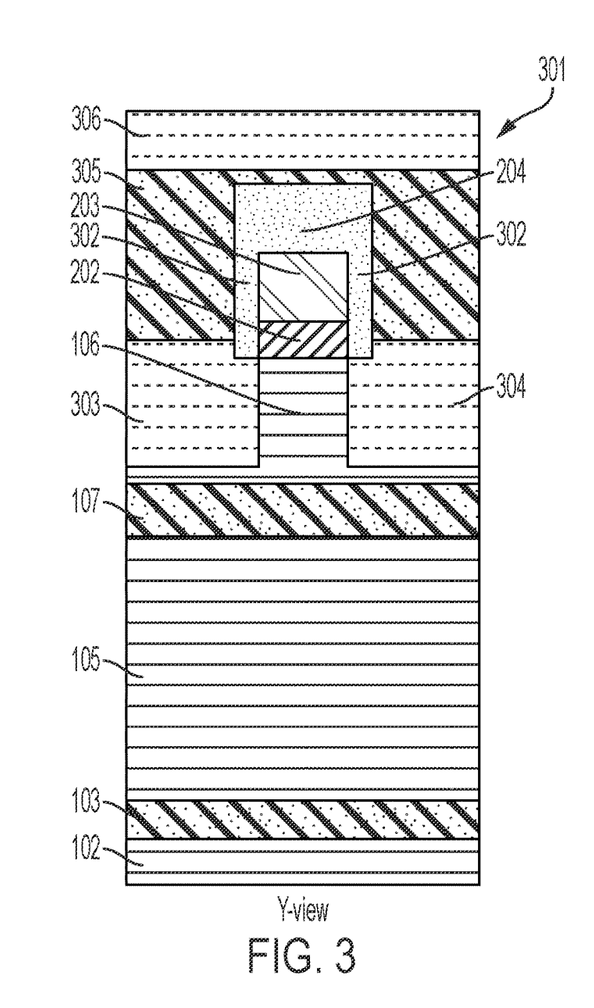
FIG. 3 is a schematic diagram illustrating a cross-sectional view of a third initial structure of a semiconductor device taken from a same perspective as FIG. 2 in accordance with one or more embodiments of the present invention.

With reference to FIG. 3, which is a cross-sectional Y-view, a third initial structure 301 is provided following several processing operations conducted with respect to the secondary initial structure 201 of FIG. 2. These processing operations include n-doped FET or p-doped FET (NFET or PFET) formation, an oxide fill and a handle wafer application. During the NFET or PFET formation, spacers 302 are deposited on opposite ends of the high-k dielectric 202 and the gate electrode 203 and the opposite ends of the second fin element 106 are formed into source/drain regions 303 and 304. The spacers 302 can be formed of the same or similar material as the spacer material 204. The oxide fill is executed following the NFET or PFET formation and results in the formation of an oxide layer 305. The oxide layer 305 is disposed on the source/drain regions 303 and 304, surrounds the spacers 302 and covers the spacer material 204. Once the oxide fill is complete, the handle wafer application is executed during which a handle wafer 306 is applied to an uppermost surface of the oxide layer 305.

At this point, in accordance with one or more embodiments of the present invention, optional operations can be executed prior to flipping. These optional operations can include, but are not limited to, the formation of contacts and the formation of one or more additional gates. As to the formation of contacts, contact formation is possible and would involve the removal of handle wafer and oxide material from the locations of the contacts and a subsequent contact formation conducted in a manner that would allow the contacts to survive further processing (i.e., high temperature processing) as described below. As to the formation of one or more additional gates, such additional gates could be formed above the gate of the third initial structure 301 of FIG. 3 though doing so would necessarily increase the height of the resulting semiconductor device and care would need to be taken in terms of handling. For purposes of clarity and brevity, the following description will refer to those cases in which none of the optional operations are taken.

Figure 4:
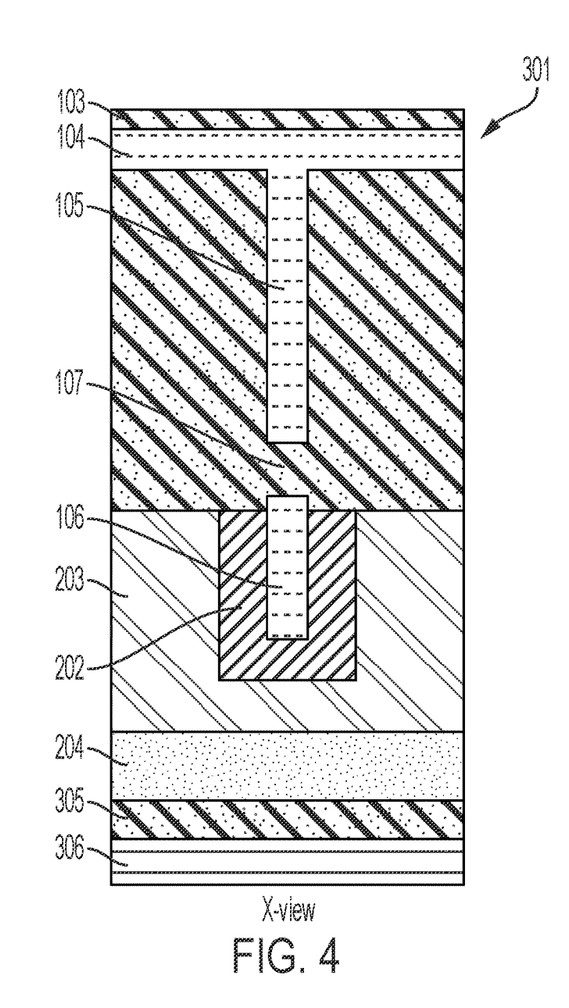
FIG. 4 is a schematic diagram illustrating a cross-sectional view of the third initial structure of FIG. 3 having been flipped over and taken from a same perspective as FIG. 1 in accordance with one or more embodiments of the present invention.

Thus, with reference to FIG. 4, which is a cross-sectional X-view taken from a same perspective as FIG. 1, the third initial structure 301 is a completed initial structure and remains intact but has been flipped upside down so that the handle wafer 306 is now the lowermost component of the first intermediate structure 301.

Figure 5:
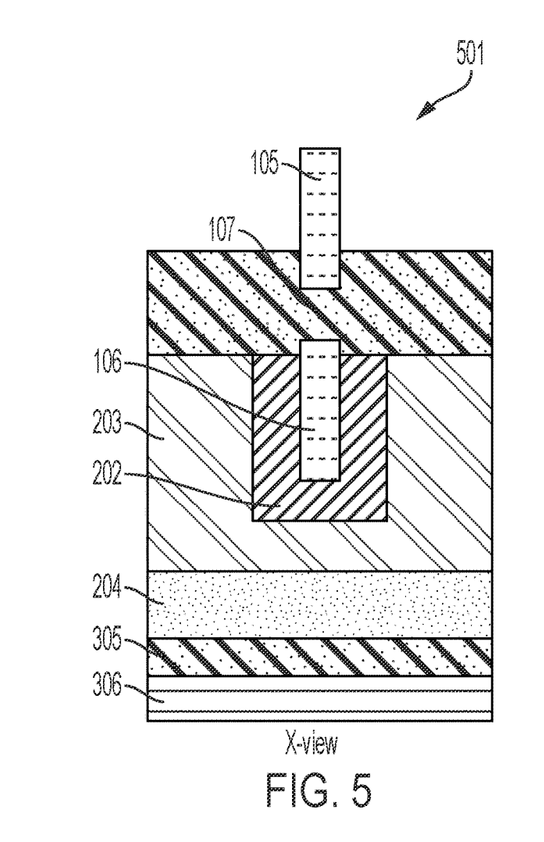
FIG. 5 is a schematic diagram illustrating a cross-sectional view of a first late-stage structure taken from a same perspective as FIGS. 1 and 4 in accordance with one or more embodiments of the present invention.

A backside process now commences with the structure shown in FIG. 5. With reference to FIG. 5, which is a cross-sectional X-view from a same perspective as FIGS. 1 and 4, a first late-stage structure 501 is provided and results from the upside down third initial structure 301 being subject to an oxide strip, a silicon thinning operation by grinding, polishing or other similar processes and a subsequent oxide recess operation. This serves to expose portions of the first fin element 105 that extend above a remainder of the additional oxide 107 that remains following the oxide recess operation.

Figure 6:
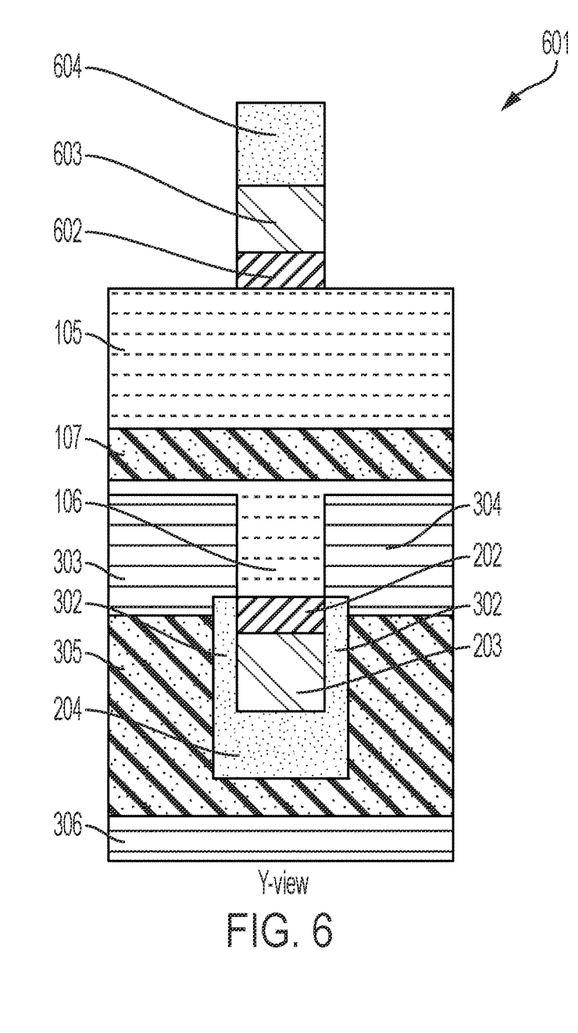
FIG. 6 is a schematic diagram illustrating a cross-sectional view of a second late-stage structure taken from a same perspective as FIGS. 2 and 3 in accordance with one or more embodiments of the present invention.

With reference to FIG. 6, which is a cross-sectional Y-view from a same perspective as FIGS. 2 and 3, a second late-stage structure 601 is provided and results from gate formation executed with respect to the first late-stage structure 501 of FIG. 5. As shown in FIG. 6, high-k dielectric 602 is deposited on and around exposed surfaces of the first fin element 105, a gate electrode 603 is formed around the high-k dielectric 602 and spacer material 604 is deposited on the gate electrode 603. The gate electrode 603 can be a conductor including, but not limited to, tungsten and other similar metallic materials and the spacer material 604 can include dielectric material.

Figure 7:
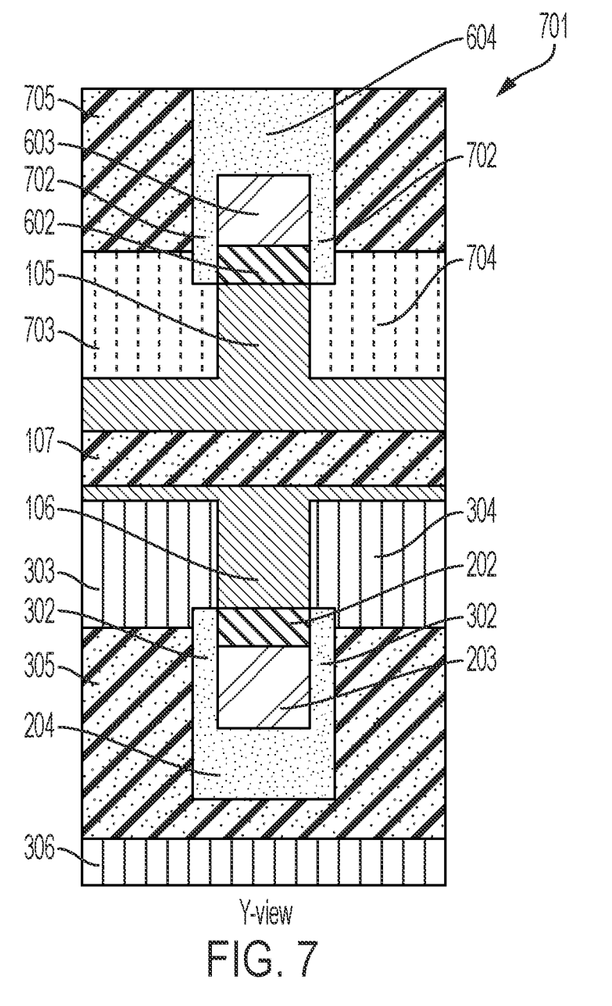
FIG. 7 is a schematic diagram illustrating a cross-sectional view of a third late-stage structure taken from a same perspective as FIG. 6 in accordance with one or more embodiments of the present invention.

With reference to FIG. 7, which is a cross-sectional Y-view from a same perspective as FIG. 6, a third late-stage structure 701 is provided following several processing operations conducted with respect to the second late-stage structure 601. These processing operations include NFET or PFET formation and an oxide fill. During the NFET or PFET formation, spacers 702 are deposited on opposite ends of the high-k dielectric 602 and the gate electrode 603 and the opposite ends of the first fin element 105 are formed into source/drain regions 703 and 704. The spacers 702 can be formed of the same or similar material as the spacer material 604. The oxide fill is executed following the NFET or PFET formation and results in the formation of an oxide layer 705. The oxide layer 705 is disposed on the source/drain regions 703 and 704, surrounds the spacers 702 and covers the spacer material 604.

At this point, in accordance with one or more embodiments of the present invention, optional operations can be executed prior to further processing. These optional operations can include, but are not limited to, the formation of one or more additional backside gates. As to the formation of one or more additional backside gates, such additional backside gates could be formed above the gate of the third late-stage structure 701 of FIG. 7 though doing so would necessarily increase the height of the resulting semiconductor device and care would need to be taken in terms of handling. For purposes of clarity and brevity, the following description will refer to those cases in which the optional operations are not taken.

Figure 8:
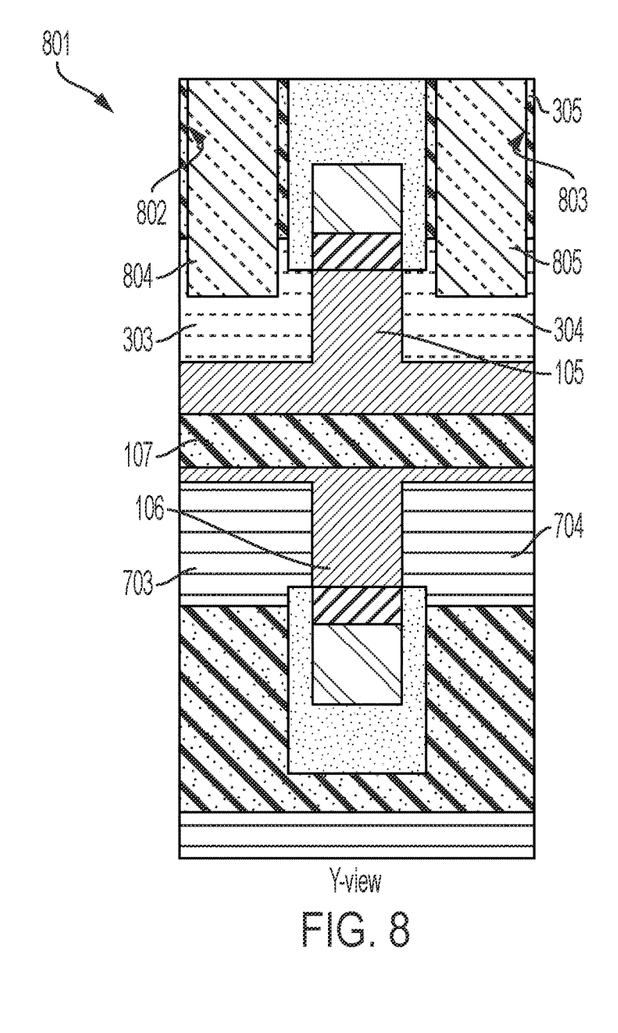
FIG. 8 is a schematic diagram illustrating a cross-sectional view of a first final structure taken from a same perspective as FIGS. 6 and 7 in accordance with one or more embodiments of the present invention.

With reference to FIG. 8, which is a cross-sectional Y-view from a same perspective as FIGS. 6 and 7, a first final structure 801 is provided and results from etch processing and contact formation. As shown in FIG. 8, the etch processing forms cavities 802 and 803 that extend through the oxide layer 705 and into the source/drain regions 703 and 704 and the contact formation forms contacts 804 and 805 in the cavities 802 and 803, respectively.

Figure 9:
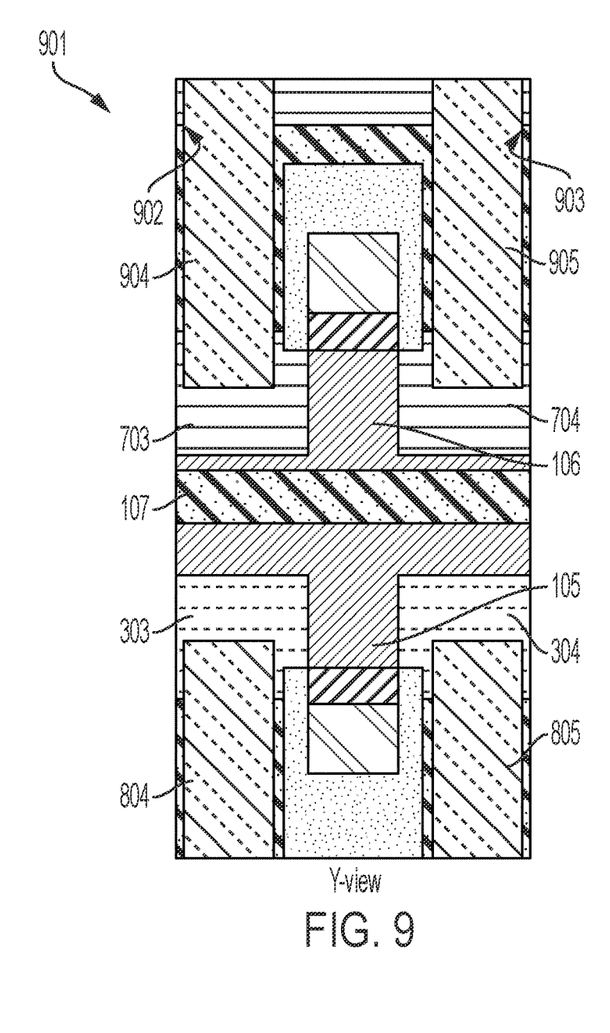
FIG. 9 is a schematic diagram illustrating a cross-sectional view of a second final structure taken from a same perspective as FIGS. 6-8 in accordance with one or more embodiments of the present invention.

With reference to FIG. 9, which is a cross-sectional Y-view from a same perspective as FIGS. 6-8, a second final structure 901 is provided and results from etch processing and contact formation. As shown in FIG. 9, the etch processing forms cavities 902 and 903 that extend through the oxide layer 305 and into the source/drain regions 303 and 304 and the contact formation forms contacts 904 and 905 in the cavities 902 and 903, respectively.

Figure 10:
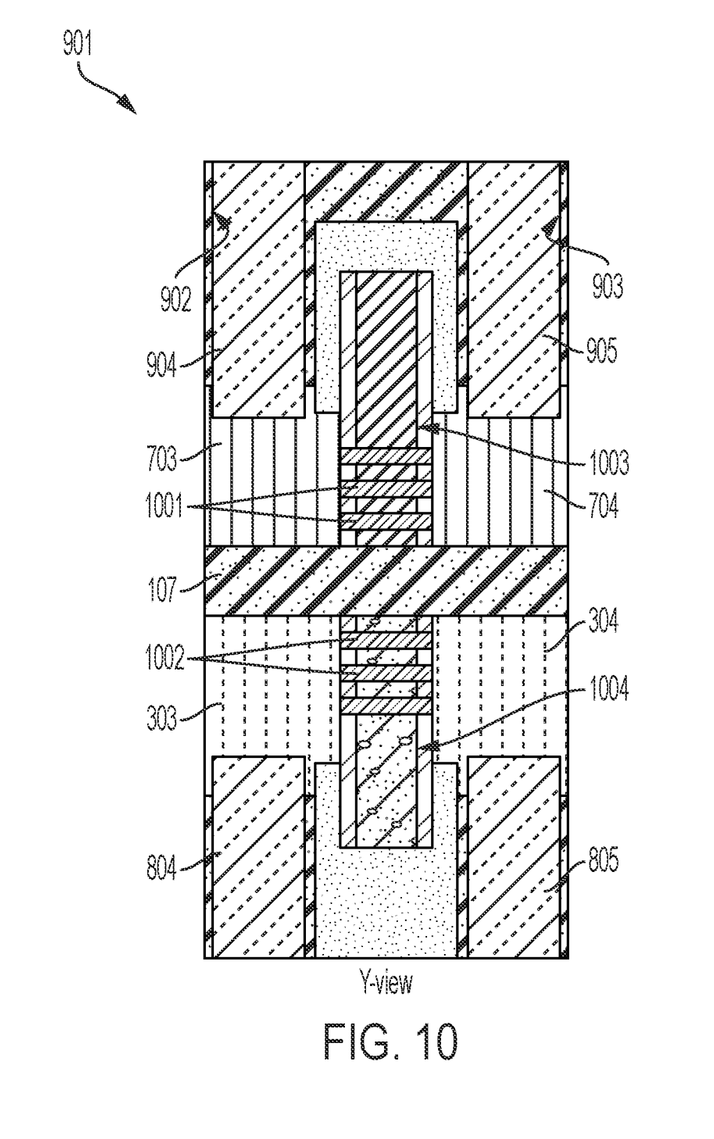
FIG. 10 is a schematic diagram illustrating a cross-sectional view of a second final structure with a nanosheet configuration, which is taken from a same perspective as FIGS. 6-9 in accordance with one or more embodiments of the present invention

With reference to FIG. 10, which is a cross-sectional Y-view as with FIG. 9, a second final structure 901' is provided in accordance with one or more alternative embodiments of the present invention. The second final structure 901' is similar to the second final structure 901 except that the first fin element 105 and the second fin element 106 are replaced by first nanosheet assembly 1001 and second nanosheet assembly 1002. In these or other cases, the gate stack 1003 surrounds multiple sides of the nanosheets in the first nanosheet assembly 1001 and the gate stack 1004 surrounds multiple sides of the nanosheets in the second nanosheet assembly 1002.

The various methods and operations described herein are generally invariant as to the "fin element" embodiments and the "nanosheet" embodiments, excepts in manners that would be understood to those with ordinary skill in the art. As a general matter, the first and second semiconductor elements, the first and second fin elements 105 and 106 and the first and second nanosheet assemblies 1001 and 1002 are interchangeable for the purposes of this description.

Figure 11:
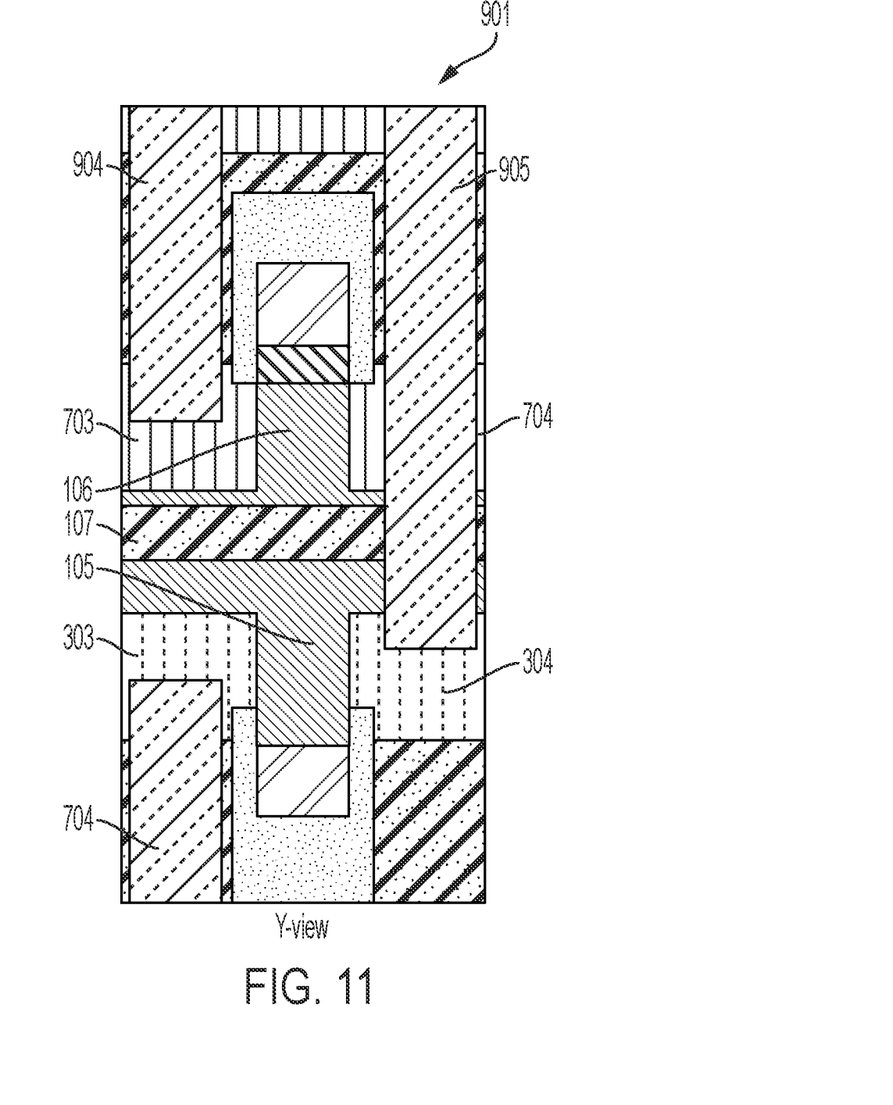
FIG. 11 is a schematic diagram illustrating a cross-sectional view of the second final structure of FIG. 9 with an extended contact taken from the same perspective as FIGS. 6-8 in accordance with one or more embodiments of the present invention.

With reference to FIG. 11, which is a cross-sectional Y-view as with FIG. 9, and in accordance with one or more embodiments of the present invention, either of the contacts 804 and 805 can be formed to extend through the source/drain regions 703 and 704 and into the source/drain regions 303 and 304 and either of the contacts 904 and 905 can be formed to extend through the source/drain regions 303 and 304 and into the source/drain regions 703 and 704. In these or other cases, non-extended contact formation to the source/drain region touched by the extended contact can be discarded. This is illustrated in FIG. 11 by the contact 905 extending into source drain region 704 and the contact 805 not being formed.

With continued reference to FIGS. 9-11, the second final structure 901 is provided as a semiconductor device including an internal semiconductor layer that is formed from the remainder of the additional oxide of FIG. 1. This internal semiconductor layer has a first side 910 facing in a first direction and a second side 920 opposite the first side 910 and facing in a second direction opposite the first direction. The second final structure 901 further includes a first semiconductor device 911 and a second semiconductor device

921. The first semiconductor device 911 is disposed on the first side 910 of the internal semiconductor layer and can include or be provided as a first FET including a fin element as in FIGS. 9 and 11 or a nanosheet formation as in FIG. 10, source and drain regions and contacts/extended contacts. The second semiconductor device 921 is disposed on the second side of the internal semiconductor layer and can include or be provided as a second FET including a fin element/nanosheets, source and drain regions and contacts/extended contacts.

While the descriptions provided above generally refer to gate first processing for both the frontside and backside processing, it is to be understood that other embodiments exist. For example, the backside processing could be provided as either gate first or gate last processing.

Figure 12:
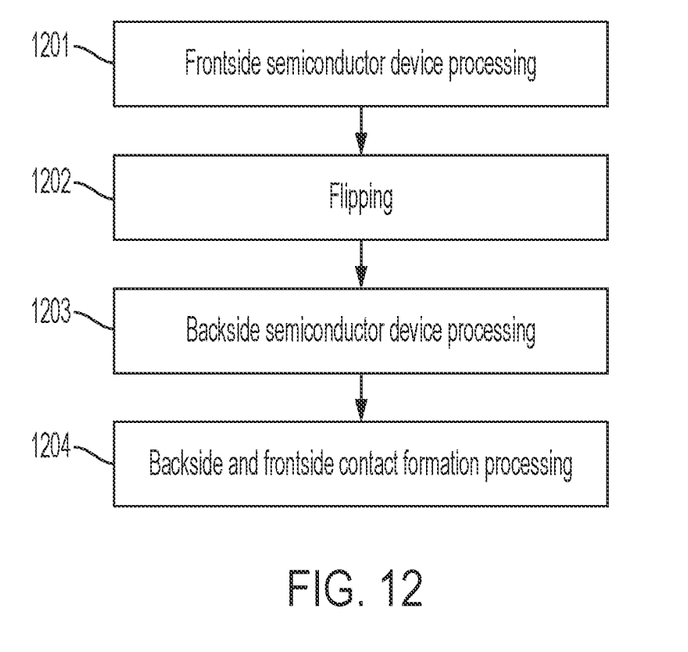
FIG. 12 is a flow diagram illustrating a semiconductor device fabrication method in accordance with one or more embodiments of the present invention.

With reference to FIG. 12, a semiconductor device fabrication method is provided. The semiconductor device fabrication method includes frontside semiconductor device processing to form a frontside FET and optionally to form one or more additional frontside FETs on a frontside of a wafer (1201) and flipping the wafer upside down (1202). The semiconductor device fabrication method further includes backside semiconductor device processing to form a backside FET and optionally to form one or more additional backside FETs on a backside of the wafer (1203). In addition, the semiconductor device fabrication method also includes backside and frontside contact formation processing on the backside and frontside of the wafer, respectively (1204).

In accordance with one or more embodiments of the present invention, the forming of the frontside FET of operation 1201 can include gate first processing and the forming of the backside FET of operation 1203 can include gate first or gate last processing. Alternatively, in accordance with one or more embodiments of the present invention, the forming of the frontside FET of operation 1201 can include gate last processing and the forming of the backside FET of operation 1203 can include gate last processing. As used herein, a gate first process refers to a CMOS process where the gate stack is deposited and patterned before the formation of source and drain regions and a gate last process is characterized in that source/drain annealing is performed before gate oxide deposition. It is to be understood that gate last processes can be executed by interchanging the sequence of certain operations described herein and that doing so is within the knowledge of a person with ordinary skill in the art.

In accordance with one or more embodiments of the present invention, the backside and frontside contact formation processing of operation 1204 can be executed following the frontside and backside semiconductor processing. In these or other cases, the backside contact formation processing of operation 1204 can be executed prior to the frontside contact formation processing of operation 1204 and the method further includes a re-flipping of the wafer between the backside and frontside contact formation processing of operation 1204.

Figure 13:
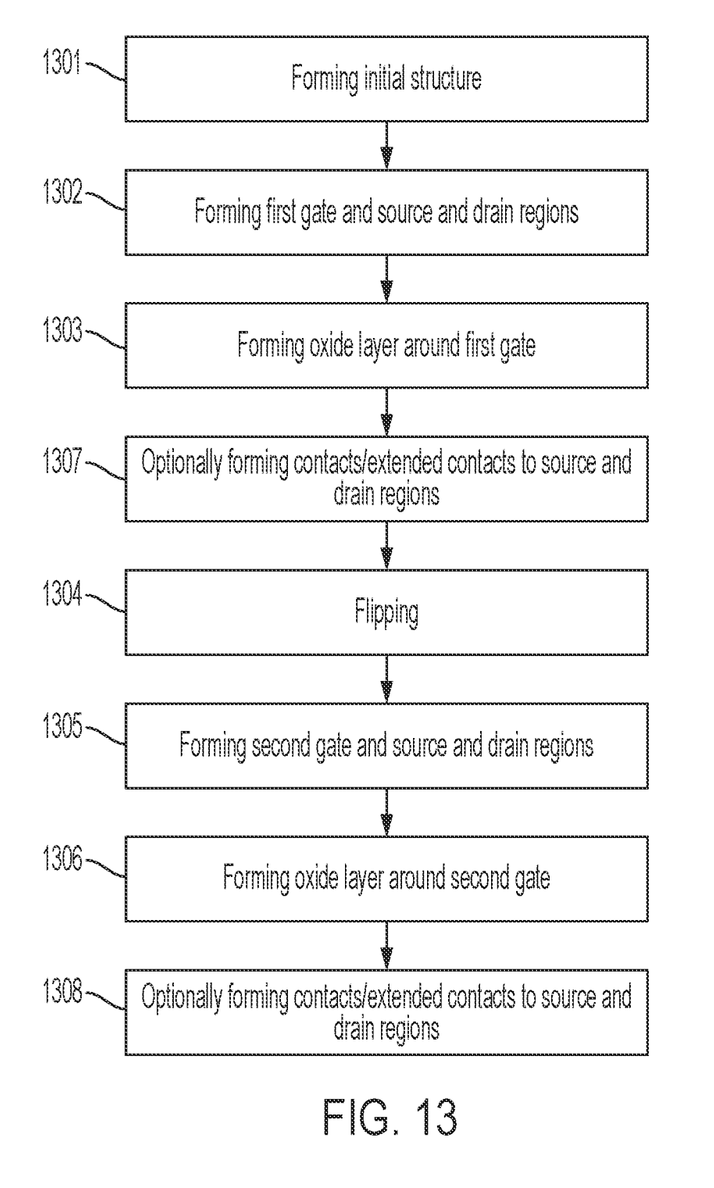
FIG. 13 is a flow diagram illustrating a semiconductor device fabrication method in accordance with one or more embodiments of the present invention.

With reference to FIG. 13, a semiconductor device fabrication method is provided. As shown in FIG. 13, the semiconductor device fabrication method includes forming an initial structure that includes a first fin element, a second fin element and oxide interposed between the first and second fin elements (1301), forming a first gate around the second fin element and forming source and drain regions at opposite ends of the second fin element (1302) and forming an oxide layer to which a handle is attached around the first gate to form a completed initial structure (1303). The semiconductor device fabrication method further includes flipping the completed initial structure (1304). In addition, the semiconductor device fabrication method also includes forming a second gate around the first fin element and forming source and drain regions at opposite ends of the first fin element (1305) and forming an oxide layer around the second gate (1306).

In accordance with one or more embodiments of the present invention, the forming of the first gate of operation 1302 can include gate first processing and the forming of the second gate of operation 1305 can include gate first or gate last processing. Alternatively, in accordance with one or more embodiments of the present invention, the forming of the first gate of operation 1302 can include gate last processing and the forming of the second gate of operation 1305 can include gate last processing.

In accordance with one or more embodiments of the present invention, the semiconductor device fabrication method further includes optionally forming contacts/extended contacts extending to the source and drain regions at the opposite ends of the second fin element prior to the flipping (1307) or forming contacts/extended contacts extending to the source and drain regions at the opposite ends of the second fin element and forming contacts/extended contacts extending to the source and drain regions at the opposite ends of the first fin element following the forming of the oxide layer around the second gate of operation 1306 (1308).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device fabrication method comprising:
    frontside semiconductor device processing on a frontside of a wafer to form a frontside gate structure;
    flipping the wafer;
    backside semiconductor device processing on a backside of the wafer to form a backside gate structure, which is aligned with the frontside gate structure;
    backside contact formation processing on the backside of the wafer following the frontside and backside semiconductor processing; and
    frontside contact formation processing on the frontside of the wafer following the backside contact formation processing,
    wherein the backside and frontside contact formation processing comprises at least one of:
    forming an extended contact that extends in a normal direction from the backside of the wafer, through a backside dielectric layer and backside source/drain (S/D) regions of the backside of the wafer so as to be completely surrounded by the backside dielectric layer and the backside S/D regions and to the frontside of the wafer with straight sides extending through the backside dielectric layer and the backside S/D regions in the normal direction; and
    forming an extended contact that extends in the normal direction from the frontside of the wafer, through a frontside dielectric layer and frontside S/D regions of the frontside of the wafer so as to be completely surrounded by the frontside dielectric layer and the frontside S/D regions and to the backside of the wafer with straight, opposite sides extending through the frontside dielectric layer and the frontside S/D regions in the normal direction.

2. The method according to claim 1, wherein the frontside and backside semiconductor device processing comprises forming frontside and backside field effect transistors (FETs), respectively.

3. The method according to claim 2, wherein:
    the forming of the frontside FET comprises gate first processing, and
    the forming of the backside FET comprises gate first or gate last processing.

4. The method according to claim 2, wherein:
    the forming of the frontside FET comprises gate last processing, and
    the forming of the backside FET comprises gate last processing.

5. The method according to claim 2, wherein the frontside and backside semiconductor device processing further comprises forming one or more additional frontside FETs and one or more additional backside FETs, respectively.

6. The method according to claim 1, wherein the flipping of the wafer comprises flipping the wafer upside down.

7. The method according to claim 1, wherein the method further comprises re-flipping the wafer between the backside and frontside contact formation processing.

8. A semiconductor device fabrication method comprising:
    forming an initial structure comprising a first semiconductor element, a second semiconductor element and oxide interposed between the first and second semiconductor elements;
    forming a first gate around the second semiconductor element and forming source and drain regions at opposite ends of the second semiconductor element;
    forming an oxide layer to which a handle is attached around the first gate to form a completed initial structure;
    flipping the completed initial structure;
    forming a second gate around the first semiconductor element and forming source and drain regions at opposite ends of the first semiconductor element; and
    forming an oxide layer around the second gate,
    wherein:
    the first and second gates are aligned,
    the semiconductor device fabrication method further comprises forming contacts extending in a normal direction to the source and drain regions at the opposite ends of each of the first and second semiconductor elements,
    the forming of the contacts extending to the source and drain regions at the opposite ends of the second semiconductor element comprises forming an extended contact extending, with straight, opposite sides through a dielectric layer and a source/drain (S/D) region in the normal direction at an opposite end of the second semiconductor element, to an S/D region at an opposite end of the first semiconductor element; and
    the forming of the contacts extending to the source and drain regions at the opposite ends of the first semiconductor element comprises forming an extended contact extending, with straight, opposite sides through a dielectric layer and an S/D region in the normal direction at an opposite end of the first semiconductor element, to a source or drain region at an opposite end of the second semiconductor element.

9. The semiconductor device fabrication method according to claim 8, wherein:
    the forming of the first gate comprises gate first processing, and the forming of the second gate comprises gate first or gate last processing.

10. The semiconductor device fabrication method according to claim 8, wherein:
the forming of the first gate comprises gate last processing, and
the forming of the second gate comprises gate last processing.

11. The semiconductor device fabrication method according to claim 8, further comprising forming contacts extending to the source and drain regions at the opposite ends of the second semiconductor element prior to the flipping.

12. The semiconductor device fabrication method according to claim 8, wherein the forming of the contacts follows the forming of the oxide layer around the second gate.

* * * * *